United States Patent
Ueta et al.

(10) Patent No.: US 9,777,401 B2
(45) Date of Patent: Oct. 3, 2017

(54) METHOD FOR PRODUCING SINGLE CRYSTAL

(71) Applicant: SUMITOMO ELECTRIC INDUSTRIES, LTD., Osaka-shi, Osaka (JP)

(72) Inventors: Shunsaku Ueta, Itami (JP); Tsutomu Hori, Itami (JP); Akira Matsushima, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 146 days.

(21) Appl. No.: 14/818,337

(22) Filed: Aug. 5, 2015

(65) Prior Publication Data

US 2016/0040317 A1 Feb. 11, 2016

(30) Foreign Application Priority Data

Aug. 8, 2014 (JP) .................................. 2014-162130
May 28, 2015 (JP) .................................. 2015-108803

(51) Int. Cl.
*C30B 23/06* (2006.01)
*C30B 29/36* (2006.01)

(52) U.S. Cl.
CPC ............ *C30B 23/066* (2013.01); *C30B 29/36* (2013.01)

(58) Field of Classification Search
CPC combination set(s) only.
See application file for complete search history.

(56) References Cited

U.S. PATENT DOCUMENTS 3,147,159 A * 9/1964 Lowe ..................... C01B 31/36
117/105
7,449,065 B1 * 11/2008 Powell ..................... C30B 11/14
117/108

FOREIGN PATENT DOCUMENTS

| JP | H09-48688 A | | 2/1997 | |
| JP | 2007-230846 | * | 9/2007 | ............ C30B 23/08 |
| JP | 2013-035705 A | | 2/2013 | |
| JP | 2013-216549 | * | 10/2013 | ............ C30B 29/36 |

OTHER PUBLICATIONS

Machine translation of JP2007-230846.*
Machine translation of JP2013-216549.*

* cited by examiner

*Primary Examiner* — Duy Deo
*Assistant Examiner* — Erin Bergner
(74) *Attorney, Agent, or Firm* — Drinker Biddle & Reath LLP

(57) ABSTRACT

A method for producing a single crystal includes a step of placing a source material powder and a seed crystal within a crucible; and a step of growing a single crystal on the seed crystal. The crucible includes a peripheral wall part and a bottom part and a lid part that are connected to the peripheral wall part to close the openings of the peripheral wall part. In the step of growing the single crystal on the seed crystal, the crucible is disposed on a spacer so as to form a space starting directly below an outer surface of the bottom part, and the peripheral wall part and an auxiliary heating member that is placed so as to face the outer surface of the bottom part with the space therebetween are heated by induction heating to sublime the source material powder to cause recrystallization on the seed crystal.

9 Claims, 7 Drawing Sheets

METHOD FOR PRODUCING SINGLE CRYSTAL

BACKGROUND OF THE INVENTION

1. Field of the Invention

The present disclosure relates to a method for producing a single crystal.

2. Description of the Related Art

A method (sublimation method) of subliming a source material powder and causing recrystallization on a seed crystal within a crucible allows production of a single crystal of silicon carbide, for example. Specifically, the following method is known: a source material powder and a seed crystal are placed within a crucible and the crucible is heated by induction heating to sublime the source material powder to cause recrystallization on the seed crystal. This is described in, for example, Japanese Unexamined Patent Application Publication Nos. 9-48688 and 2013-35705.

SUMMARY OF THE INVENTION

A method for producing a single crystal according to the present disclosure includes a step of placing a source material powder and a seed crystal within a crucible and a step of growing a single crystal on the seed crystal. The crucible includes a peripheral wall part being hollow and having openings at both ends, a bottom part connected to the peripheral wall part to close one of the openings of the peripheral wall part, and a lid part connected to the peripheral wall part to close the other one of the openings of the peripheral wall part and having a holder that holds the seed crystal. In the step of placing the source material powder and the seed crystal within the crucible, the source material powder is placed so as to be in contact with an inner surface of the bottom part and the seed crystal is placed so as to be held by the holder. In the step of growing the single crystal on the seed crystal, the crucible is disposed on a spacer so as to form a space starting directly below an outer surface of the bottom part, and the peripheral wall part and an auxiliary heating member that is placed so as to face the outer surface of the bottom part with the space therebetween are heated by induction heating to sublime the source material powder to cause recrystallization on the seed crystal.

DESCRIPTION OF THE PREFERRED EMBODIMENTS

When a peripheral wall part of a crucible is heated to sublime a source material powder, the content of the crucible has a temperature difference in the radial direction. Specifically, a region closer to the peripheral wall part being heated has a higher temperature while a region farther from the peripheral wall part, that is, a region closer to the radial center has a lower temperature. As a result, is some cases, the source material powder positioned in the region closer to the center does not sufficiently sublime, resulting in a low growth rate of the single crystal.

A method for producing a single crystal according to the present disclosure includes a step of placing a source material powder and a seed crystal within a crucible; and a step of growing a single crystal on the seed crystal. The crucible includes a peripheral wall part being hollow and having openings at both ends, a bottom part connected to the peripheral wall part to close one of the openings of the peripheral wall part, and a lid part connected to the peripheral wall part to close the other one of the openings of the peripheral wall part and having a holder that holds the seed crystal. In the step of placing the source material powder and the seed crystal within the crucible, the source material powder is placed so as to be in contact with an inner surface of the bottom part and the seed crystal is placed so as to be held by the holder. In the step of growing the single crystal on the seed crystal, the crucible is disposed on a spacer so as to form a space starting directly below an outer surface of the bottom part, and the peripheral wall part and an auxiliary heating member that is placed so as to face the outer surface of the bottom part with the space therebetween are heated by induction heating to sublime the source material powder to cause recrystallization on the seed crystal.

In this method for producing a single crystal according to the present disclosure, the crucible is disposed on a spacer so as to form a space starting directly below an outer surface of the bottom part. The auxiliary heating member that is placed so as to face the outer surface of the bottom part with the space therebetween, the space being formed with the spacer, is heated by induction heating. Thus, the auxiliary heating member heated by induction heating emits radiant heat, which heats the bottom part of the crucible. For this reason, a region close to the central axis has a high temperature, compared with a case of not using the auxiliary heating member. As a result, sublimation of the source material powder positioned in the region close to the central axis is promoted, which results in an increase in the growth rate of the single crystal. Thus, this method for producing a single crystal according to the present disclosure allows suppression of a decrease in the growth rate of a single crystal.

In the method for producing a single crystal, the spacer may be hollow and have openings at both ends, and a region surrounded by an inner peripheral surface of the spacer may serve as the space starting directly below the outer surface of the bottom part. In this case, heat dissipation through the space starting directly below the outer surface of the bottom part is suppressed. As a result, the source material powder positioned in the region close to the central axis can be further heated.

In the method for producing a single crystal, the auxiliary heating member may be formed of graphite. Graphite, which has high heat resistance and can be heated by induction heating, is suitable as a material for forming the auxiliary heating member.

In the method for producing a single crystal, the spacer may be formed of graphite. In this case, the spacer is also heated by induction heating. Thus, the spacer emits radiant heat, which heats the bottom part of the crucible. As a result, the source material powder positioned in the region close to the central axis can be further heated.

In the method for producing a single crystal, the auxiliary heating member may be provided with, in a region facing the outer surface of the bottom part, a coating layer having a lower emissivity than the auxiliary heating member. In this case, the coating layer reflects more light than the auxiliary heating member. This increases the efficiency of heating the bottom part of the crucible.

In the method for producing a single crystal, the coating layer may be disposed on a central region of the auxiliary heating member, the central region facing the outer surface of the bottom part and surrounding a central axis passing through a center of the bottom part and a center of the auxiliary heating member, and a peripheral region of the auxiliary heating member, the peripheral region facing the outer surface of the bottom part and surrounding the central region, may not be covered with the coating layer and may be exposed to the space. The coating layer is thus formed only in a region close to the central axis, so that sublimation of the source material powder positioned in the region close to the central axis can be promoted.

in the method for producing a single crystal, in the step of placing the source material powder and the seed crystal within the crucible, the source material powder and the seed crystal that are formed of silicon carbide may be placed within the crucible, and in the step of growing the single crystal on the seed crystal, the single crystal formed of silicon carbide may be grown on the seed crystal. This method allows efficient production of a silicon carbide single crystal.

In the method for producing a single crystal, the crucible may have an inner diameter of 110 mm or more. In such a case where the crucible has a large inner diameter of 110 mm or more, a temperature difference in the content of the crucible in the radial direction increases beyond the allowable limit, which results in a considerable decrease in the growth rate of the single crystal due to insufficient sublimation of the source material powder near the central axis. Even in this case, the method for producing a single crystal with the crucible equipped with the auxiliary heating member allows suppression of the decrease in the growth rate of the single crystal.

In the method for producing a single crystal, the auxiliary heating member may have a through-hole, and in the step of growing the single crystal on the seed crystal, a radiation thermometer may measure a temperature of the crucible through the through-hole. This allows the temperature of the crucible to be easily determined in the step of growing the single crystal on the seed crystal.

Embodiment

Hereinafter, an embodiment in which a single crystal of silicon carbide is produced will be described as an example with reference to drawings. In these drawings, the same or corresponding components are denoted by the same reference numerals and repetitive descriptions thereof may be omitted.

Figure 1:
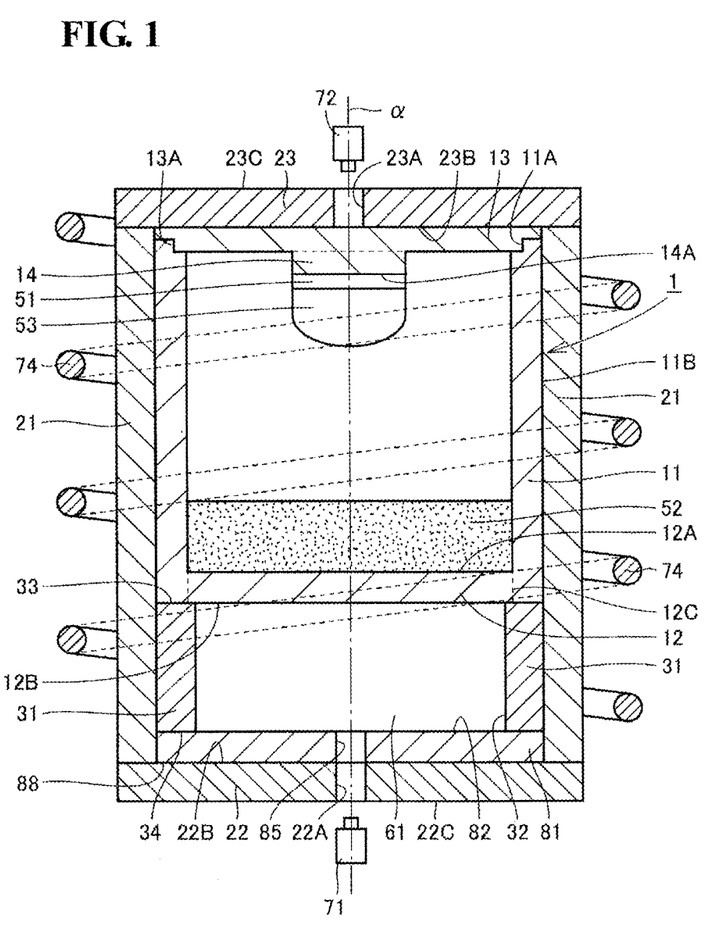
FIG. 1 is a schematic sectional view illustrating the structure of an apparatus for producing a single crystal according to an embodiment.

Referring to FIG. 1, a single-crystal production apparatus 100 according to this embodiment includes a crucible 1, a spacer 31, an auxiliary heating plate 81 serving as an auxiliary heating member, heat-insulating members 21, 22, and 23, radiation thermometers 71 and 72, and an induction heating coil 74.

The crucible 1 is formed of a material that can be heated by induction heating, such as graphite. The crucible 1 includes a peripheral wall part 11 being hollow and having openings at both ends; a bottom part 12 connected to the peripheral wall part 11 to close one of the openings of the peripheral wall part 11; and a lid part 13 connected to the peripheral wall part 11 to close the other one of the openings of the peripheral wall part 11 and having a holder 14 that holds a seed crystal 51. In this embodiment, the peripheral wall part 11 has the shape of a hollow cylinder. The inner diameter of the peripheral wall part 11, that is, the inner diameter of the crucible 1, is 110 mm or more, for example. The bottom part 12 has the shape of a disc. The peripheral wall part 11 and the bottom part 12 are integrated.

The lid part 13 is detachably attached to the peripheral wall part 11. The lid-part bonding surface 13A formed in an outer circumferential portion of the lid part 13 is brought into contact with a peripheral-wall-part bonding surface 11A formed in an inner circumferential portion of the peripheral wall part 11, so that the lid part 13 is fixed to the peripheral wall part 11. The lid-part bonding surface 13A and the peripheral-wall-part bonding surface 11A may have spiral screw grooves, for example. The holder 14 is formed on one of the main surfaces of the lid part 13 so as to protrude from a central portion of the main surface. When the lid part 13 is attached to the peripheral wall part 11, the holder 14 is positioned so as to include a central axis α. A holding surface 14A for holding a seed crystal is formed at the end of the holder 14.

The spacer 31 is formed of a molded heat-insulating material, for example. The spacer 31 is mainly formed of carbon and has a density of 0.25 $g/cm^3$ or less, for example. The spacer 31 has the shape of a hollow cylinder. The outer diameter of the spacer 31 is substantially equal to that of the crucible 1. The crucible 1 is disposed on the spacer 31 such that an outer surface 12B of the bottom part 12 of the crucible 1 is in contact with a first end surface 33 of the spacer 31. Thus, a space 61 is formed so as to start directly below the outer surface 12B of the bottom part 12 of the crucible 1. In this state where the crucible 1 is disposed on the spacer 31, an outer surface 11B of the peripheral wall part 11 of the crucible 1 and the outer circumferential surface of the spacer 31 are positioned so as to surround the same cylindrical plane. The spacer 31 has an inner diameter that is smaller, for example, by 10 mm or more and 60 mm or less, than the outer diameter thereof.

The auxiliary heating plate 81 is disposed so as to face the outer surface 12B of the bottom part 12 with the space 61 therebetween. Specifically, the auxiliary heating plate 81 has the shape of a disc. The spacer 31 is disposed on a first main surface 82 of the auxiliary heating plate 81. In other words, the first main surface 82 of the auxiliary heating plate 81 is in contact with a second end surface 34 of the spacer 31. The outer circumferential surface of the spacer 31 and the outer circumferential surface of the auxiliary heating plate 81 are positioned so as to surround the same cylindrical plane. The auxiliary heating plate 81 is formed of a material that can be heated by induction heating, specifically, graphite. The auxiliary heating plate 81 has a density of 1.6 $g/cm^3$ or more, for example.

The heat-insulating members 21, 22, and 23 are each formed of a molded heat-insulating material, for example. The heat-insulating members 21, 22, and 23 are mainly formed of carbon and have a density of 0.25 $g/cm^3$ or less, for example. The heat-insulating member 22 has the shape of a disc. The auxiliary heating plate 81 is disposed on the heat-insulating member 22 such that a second main surface 88 of the auxiliary heating plate 81 is in contact with a first main surface 22B of the heat-insulating member 22. The heat-insulating member 21 has the shape of a hollow cylinder. The heat-insulating member 21 is disposed so as to entirely cover the outer circumferential surface of the spacer 31, the outer circumferential surface of the auxiliary heating plate 81, and the outer surface 11B of the peripheral wall part 11 of the crucible 1. The heat-insulating member 23 is disposed on an outer surface of the lid part 13 so as to cover the outer surface of the lid part 13 of the crucible 1. The spacer 31, the auxiliary heating plate 81, and the crucible 1 are surrounded by the heat-insulating members 21, 22, and 23.

A through-hole 22A is formed so as to extend through the heat-insulating member 22 in the thickness direction, in a region of the heat-insulating member 22, the region including the central axis α. A through-hole 85 is also formed so as to extend through the auxiliary heating plate 81 in the thickness direction, in a region of the auxiliary heating plate 81, the region including the central axis α. The radiation thermometer 71 is disposed so as to face the bottom part 12 of the crucible 1 through the through-hole 22A and the through-hole 85. The radiation thermometer 71 measures the temperature of the bottom part 12, which allows determination of the temperature of a source material powder 52. On the other hand, a through-hole 23A is formed so as to extend through the heat-insulating member 23 in the thickness direction, in a region of the heat-insulating member 23, the region including the central axis α. The radiation thermometer 72 is disposed so as to face the lid part 13 of the crucible 1 through the through-hole 23A. The radiation thermometer 72 measures the temperature of the lid part 13, which allows determination of the temperature of the seed crystal 51.

The induction heating coil 74 is disposed so as to spirally surround the outer surface 11B of the peripheral wall part 11 of the crucible 1, the outer surface 11B being covered with the heat-insulating member 21. The induction heating coil 74 is connected to a power supply (not shown). The region surrounded by the induction heating coil 74 contains the spacer 31, the auxiliary heating plate 81, and the crucible 1 that are covered with the heat-insulating members 21, 22, and 23.

Figure 2:
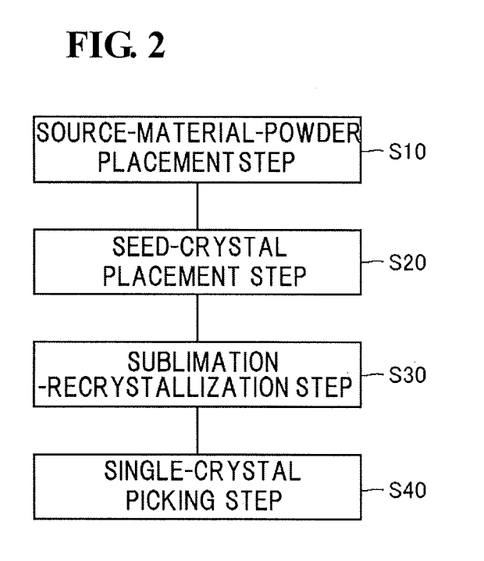
FIG. 2 is a flow chart illustrating the outline of a method for producing a single crystal.

Hereinafter, a method for producing a silicon carbide single crystal with the above-described single-crystal production apparatus 100 will be described. Referring to FIG. 2, in a method for producing a silicon carbide single crystal according to this embodiment, a source-material-powder placement step is firstly carried out as Step S10. In this Step S10, referring to FIG. 1, the source material powder 52 is placed so as to be in contact with an inner surface 12A of the bottom part 12 of the crucible 1. Specifically, while the lid part 13 is detached from the crucible 1, the source material powder 52 is placed into the crucible 1.

Subsequently, a seed-crystal placement step is carried out as Step S20. In this Step S20, the seed crystal 51 is placed on the holder 14. Specifically, for example, the seed crystal 51 is bonded to the holder 14 of the lid part 13 having been detached from the peripheral wall part 11. The seed crystal 51 is bonded to the holding surface 14A of the holder 14. Subsequently, the lid part 13 is attached to the peripheral wall part 11. Thus, the seed crystal 51 is disposed in a region intersecting the central axis α. As a result of Steps S10 and S20, the source material powder 52 and the seed crystal 51 are placed within the crucible 1.

Subsequently, a sublimation-recrystallization step is carried out as Step S30. In this Step S30, the source material powder 52 is sublimed to cause recrystallization on the seed crystal 51 to thereby grow the single crystal 53 on the seed crystal 51. Specifically, this step is carried out in the following manner, for example. While the crucible 1 containing the source material powder 52 and the seed crystal 51, the spacer 31, and the auxiliary heating plate 81 are stacked in the above-described manner, the crucible 1, the spacer 31, and the auxiliary heating plate 81 are covered with the heat-insulating members 21, 22, and 23. The crucible 1, the spacer 31, and the auxiliary heating plate 81 covered with the heat-insulating members 21, 22, and 23 are placed in a region surrounded by the induction heating coil 74 as illustrated in FIG. 1. Application of a high-frequency current to the induction heating coil 74 allows the peripheral wall part 11, the bottom part 12, and the auxiliary heating plate 81 to be heated by induction heating. In this case, the peripheral wall part 11 is heated the most intensely. In the bottom part 12, the closer to the central axis α, the less the temperature is elevated by induction heating. On the other hand, the auxiliary heating plate 81 heated by induction heating emits radiant heat, which heats the bottom part 12. In other words, the bottom part 12 is heated not only by induction heating but also by radiant heat emitted by the auxiliary heating plate 81. As a result, the source material powder 52 that is powder of silicon carbide sublimes, resulting in generation of source material gas, which is gas of silicon carbide. This source material gas is supplied onto the seed crystal 51. As a result, recrystallization from the source material gas occurs on the seed crystal 51, so that the single crystal 53 of silicon carbide is formed on the seed crystal 51. While these growth conditions are maintained, the single crystal 53 grows in the direction along the central axis α. After a predetermined heating time lapses, the heating is stopped. Thus, Step S30 is completed.

Subsequently, a single-crystal picking step is carried out as Step S40. In this Step S40, the single crystal having grown within the crucible 1 by Step S30 is taken out from the crucible 1. Specifically, after the heating in Step S30 is stopped, the crucible 1 is taken out from the region surrounded by the induction heating coil 74. After that, the lid part 13 is detached from the crucible 1. The single crystal 53 is picked up from the lid part 13. Thus, this step completes the method for producing a single crystal according to this embodiment. The picked single crystal is sliced into wafers and used for production of semiconductor devices, for example.

As described above, in the method for producing a single crystal according to this embodiment, the auxiliary heating plate 81, which is disposed so as to face the outer surface 12B of the bottom part 12 with the space 61 (formed with the spacer 31) therebetween, is heated by induction heating. Thus, the auxiliary heating plate 81 emits radiant heat, which heats the bottom part 12 of the crucible 1. For this reason, a region close to the central axis α has a high temperature, compared with a case of not employing the auxiliary heating plate 81. As a result, the source material powder 52 positioned in the region close to the central axis α sufficiently sublimes, resulting in a high growth rate of the single crystal 53. Thus, the method for producing a single crystal according to this embodiment allows an increase in the growth rate of the single crystal 53.

First Modification

Hereinafter, a first modification relating to the embodiment will be described. Basically, as in the embodiment, a method for producing a single crystal according to the first modification is carried out to provide advantages. However, the method for producing a single crystal according to the first modification is different from the embodiment in the configuration of the spacer 31 and the auxiliary heating plate 81.

Figure 3:
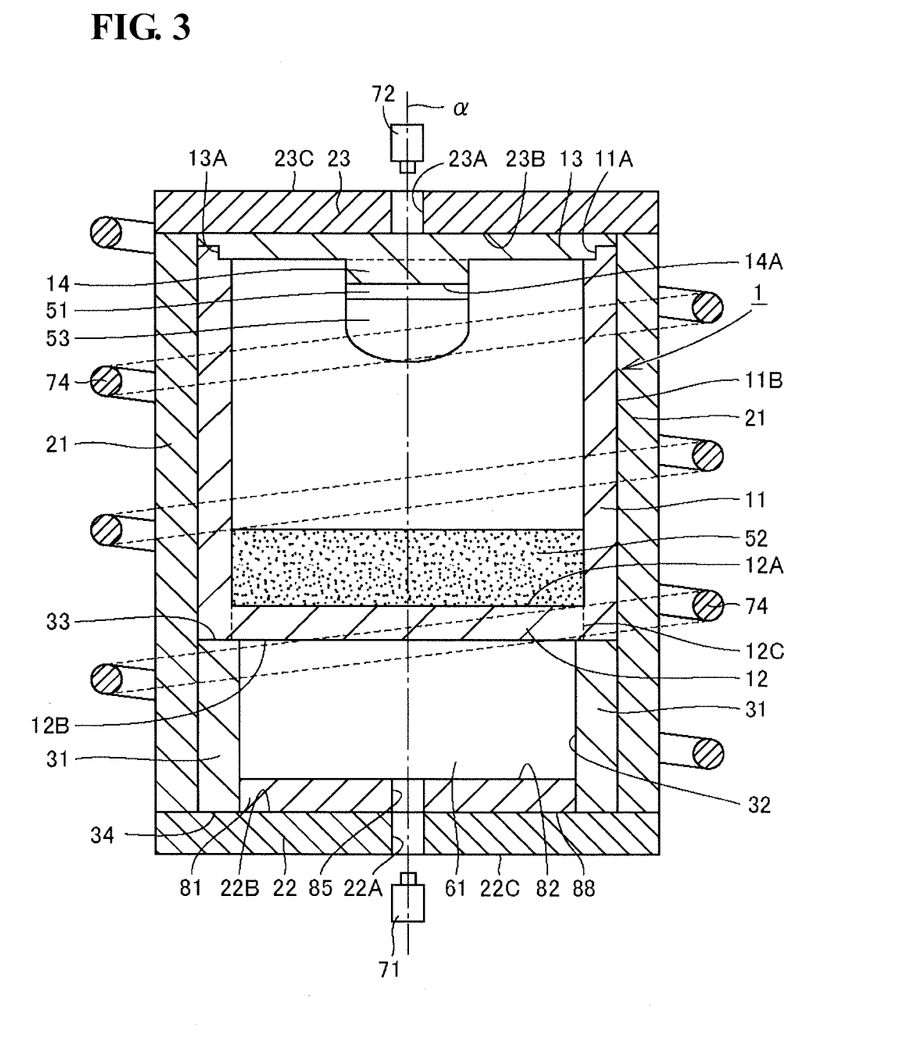
FIG. 3 is a schematic sectional view illustrating the structure of an apparatus for producing a single crystal according to a first modification.

Specifically, referring to FIGS. 3 and 1, the spacer 31 in the first modification is formed of graphite. The spacer 31 has a density of 1.6 g/cm³ or more, for example. The auxiliary heating plate 81 in the first modification is disposed such that the circumferential surface faces an inner circumferential surface 32 of the spacer 31, specifically, the circumferential surface is in contact with the whole circumference of the inner circumferential surface 32 of the spacer 31. The spacer 31 and the auxiliary heating plate 81 are disposed such that the second end surface 34 of the spacer 31 and the second main surface 88 of the auxiliary heating plate 81 form the same plane.

Since the spacer 31 is formed of graphite, the spacer 31 is heated by induction heating in Step S30. Thus, the spacer 31 emits radiant heat, which heats the bottom part 12 of the crucible 1. As a result, sublimation of the source material powder 52 positioned in a region close to the central axis α further promoted, which results in an increase in the growth rate of the single crystal 53.

Second Modification

Hereinafter, a second modification relating to the embodiment will be described. Basically, as in the embodiment, a method for producing a single crystal according to the second modification is carried out to provide advantages. However, the method for producing a single crystal according to the second modification is different from the embodiment in the configuration of the auxiliary heating plate 81.

Figure 4:
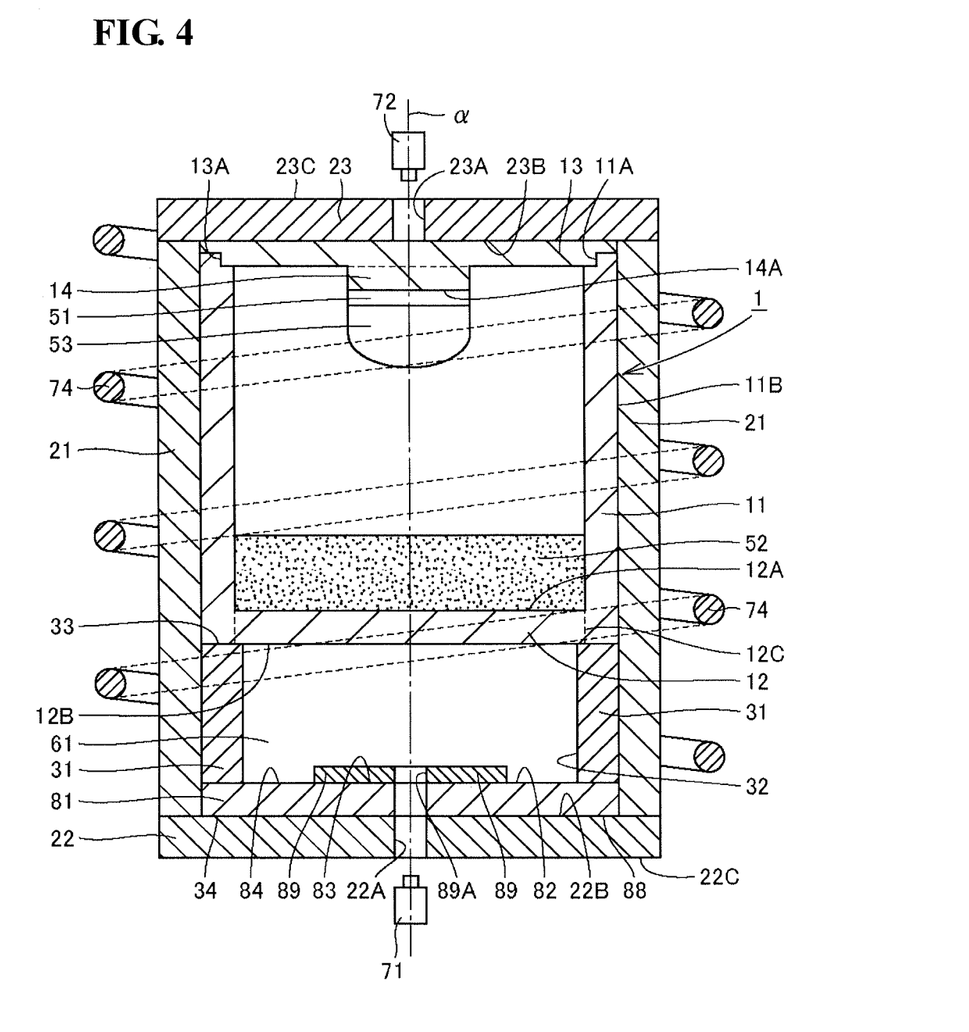
FIG. 4 is a schematic sectional view illustrating the structure of an apparatus for producing a single crystal according to a second modification.

Specifically, referring to FIGS. 4 and 1, the auxiliary heating plate 81 in the second modification is provided with, in a region facing the outer surface 12B of the bottom part 12, a coating layer 89 having a lower emissivity than the auxiliary heating plate 81. The coating layer 89 is formed on a central region 83 of the auxiliary heating plate 81, the central region 83 facing the outer surface 12B of the bottom part 12 and surrounding the central axis α, which is an imaginary axis passing through the center of the bottom part 12 and the center of the auxiliary heating plate 81. On the other hand, a peripheral region 84 of the auxiliary heating plate 81, the peripheral region 84 facing the outer surface 12B of the bottom part 12 and surrounding the central region 83, is not covered with the coating layer 89 and is exposed to the space 61. In other words, the coating layer 89 is formed only on the central region 83 and not formed on the peripheral region 84. Stated another way, the coating layer 89 is formed only in the region close to the central axis α. Examples of the material for forming the coating layer 89 include TaC, Ta₂C, ZrC, NbC, Nb₂C, TiC, MoC, Mo₂C, and WC.

The coating layer 89, which is formed on the auxiliary heating plate 81, reflects more light than the auxiliary heating plate 81. This allows efficient heating of the bottom part 12 of the crucible 1. In this modification, the coating layer 89 is formed only in the region close to the central axis α. For this reason, sublimation of the source material powder 52 positioned in the region close to the central axis α can be further promoted.

Third Modification

Hereinafter, a third modification will be described. Basically, as in the first modification, a method for producing a single crystal according to the third modification is carried out to provide advantages. However, the method for producing a single crystal according to the third modification is different from the first modification in the positional relationships between the induction heating coil 74 and the crucible 1 or the like.

Figure 5:
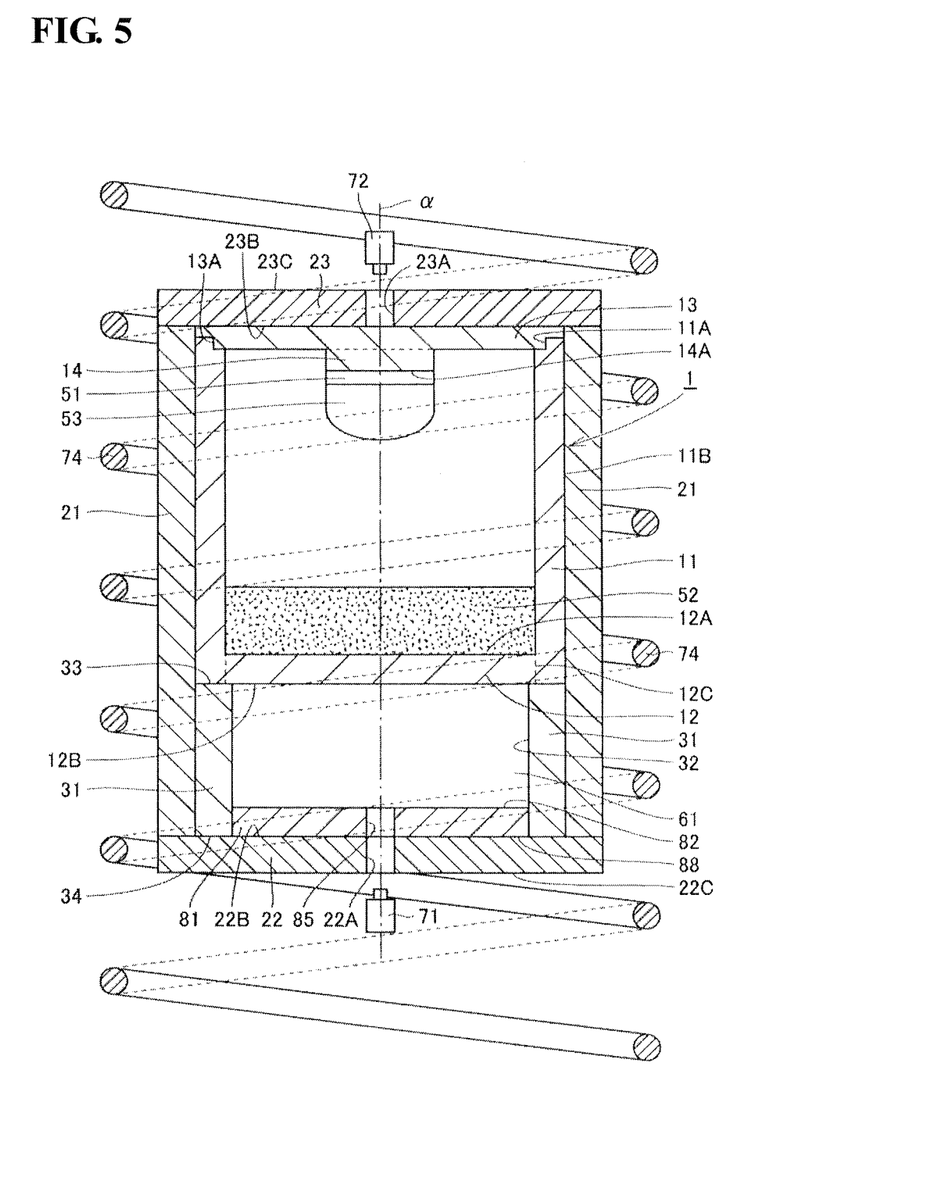
FIG. 5 is a schematic sectional view illustrating the structure of an apparatus for producing a single crystal according to a third modification.

Specifically, referring to FIGS. 5 and 3, in the third modification, the crucible 1, the spacer 31, and the auxiliary heating plate 81 are disposed so as to be surrounded by the induction heating coil 74. Stated another way, the crucible 1, the spacer 31, and the auxiliary heating plate 81 are disposed within the space surrounded by the induction heating coil 74.

The crucible 1, the spacer 31, and the auxiliary heating plate 81 are all surrounded by the induction heating coil 74, so that the crucible 1, the spacer 31, and the auxiliary heating plate 81 are entirely heated in Step S30 with more certainty. As a result, sublimation of the source material powder 52 positioned in the region close to the central axis α is further promoted, which results in an increase in the growth rate of the single crystal 53.

Fourth Modification

Hereinafter, a fourth modification will be described. Basically, as in the third modification, a method for producing a single crystal according to the fourth modification is carried out to provide advantages. However, the method for producing a single crystal according to the fourth modification is different from the third modification in the configuration of the induction heating coil 74.

Figure 6:
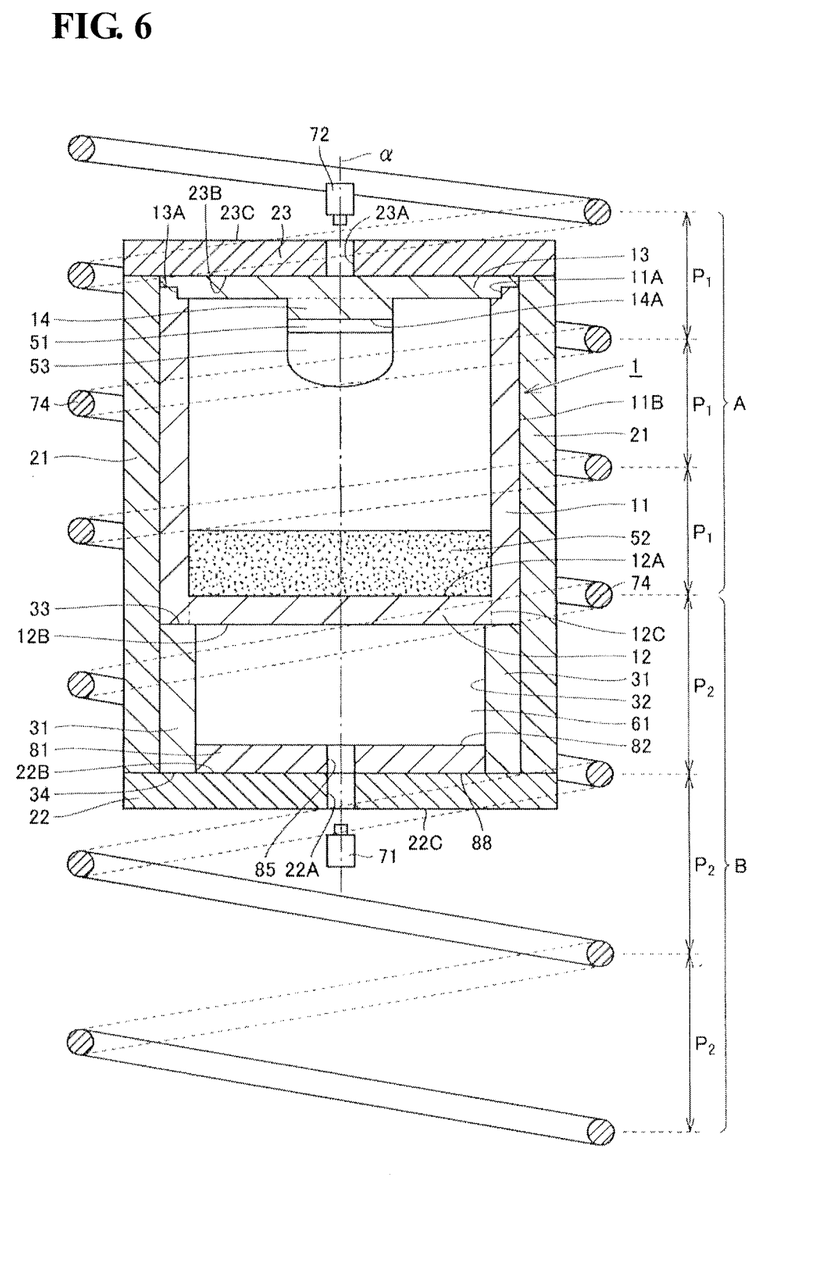
FIG. 6 is a schematic sectional view illustrating the structure of an apparatus for producing a single crystal according to a fourth modification.

Specifically, referring to FIGS. 6 and 5, in the fourth modification, the pitch of the induction heating coil 74 changes in the direction along the central axis α. More specifically, in the direction along the central axis α, the induction heating coil 74 has a pitch $P_1$ in a region A corresponding to the crucible 1 and has a pitch $P_2$ in a region B corresponding to the spacer 31 and the auxiliary heating plate 81; and the pitches $P_1$ and $P_2$ are different from each other. The pitch $P_2$ is larger than the pitch $P_1$, for example.

By using the induction heating coil 74 whose pitch changes in the direction along the central axis α, the crucible 1, the spacer 31, and the auxiliary heating plate 81 are easily heated individually at appropriate and different temperatures. For example, the crucible 1 is easily heated at a higher temperature than the spacer 31 and the auxiliary heating plate 81. In this way, by individually heating the crucible 1, the spacer 31, and the auxiliary heating plate 81 at appropriate temperatures, the growth rate of the single crystal 53 can be further increased easily.

Fifth Modification

Hereinafter, a fifth modification will be described. Basically, as in the third modification, a method for producing a single crystal according to the fifth modification is carried out to provide advantages. However, the method for producing a single crystal according to the fifth modification is different from the third modification in the configuration and control method of the induction heating coil.

Figure 7:
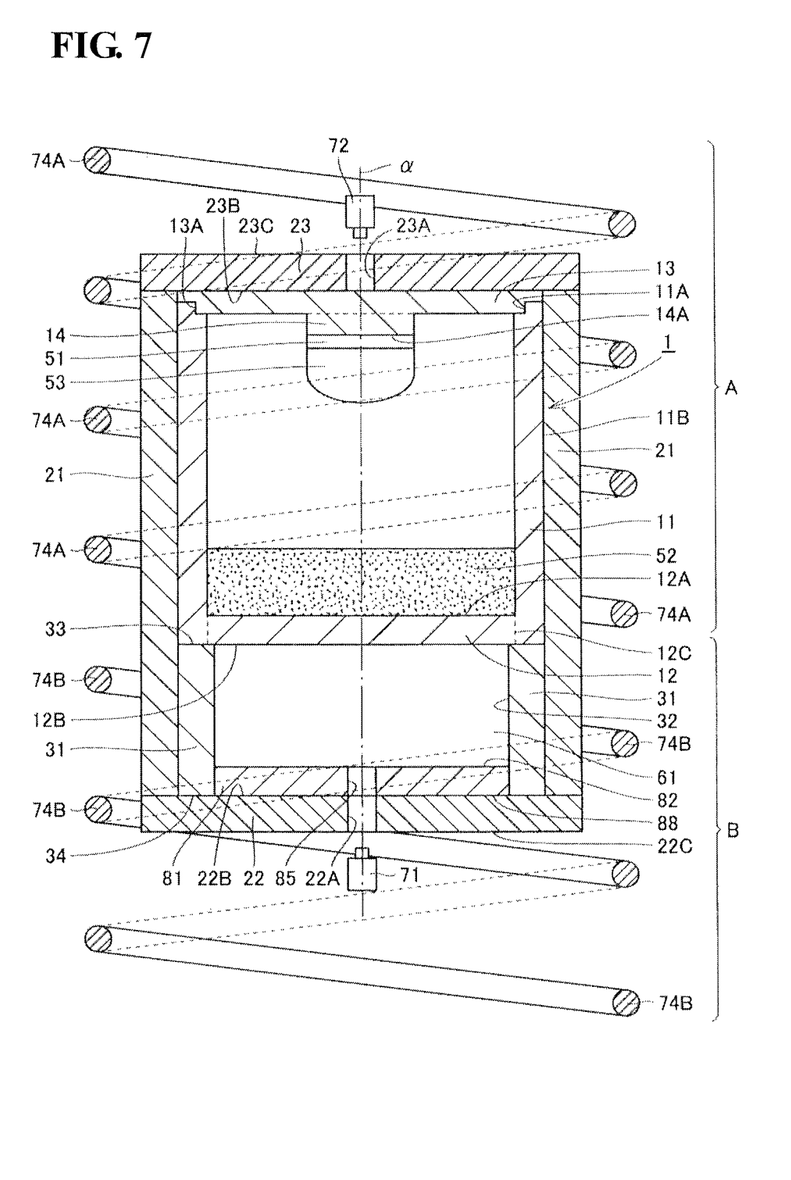
FIG. 7 is a schematic sectional view illustrating the structure of an apparatus for producing a single crystal according to a fifth modification.

Specifically, referring to FIGS. 7 and 5, in the fifth modification, the induction heating coil is divided into induction heating coils that are independently controlled and arranged in the direction along the central axis α. More specifically, in the direction along the central axis α, the induction heating coil of the modification includes an induction heating coil 74A in a region A corresponding to the crucible 1 and an induction heating coil 74B in a region B corresponding to the spacer 31 and the auxiliary heating plate 81. The induction heating coil 74A and the induction heating coil 74B are independently controlled.

By using such configuration and control method of the induction heating coil, the crucible 1, the spacer 31, and the auxiliary heating plate 81 are individually heated at appropriate and different temperatures easily. For example, the crucible 1 is easily heated at a higher temperature than the spacer 31 and the auxiliary heating plate 81. In this way, by individually heating the crucible 1, the spacer 31, and the auxiliary heating plate 81 at appropriate temperatures, the growth rate of the single crystal 53 can be further increased easily.

Note that the structures of the single-crystal production apparatuses in the above-described embodiment and modifications are examples of usable structures and are not limitative. For example, some of the structures described in the embodiment and modifications may be appropriately combined and the resultant structure may be employed. In the embodiment and modifications, the cases of producing a single crystal formed of silicon carbide are described. However, a method for producing a single crystal according to the present disclosure also allows production of other single crystals that can be produced by a sublimation method, such as a single crystal formed of aluminum nitride. Also, the above-described embodiment employs carbon (graphite) as an example of a material that is used for the auxiliary heating member (auxiliary heating plate 81) and can be heated by induction heating. However, the material that can be used for the auxiliary heating member is not limited to graphite. Specifically, various materials that can be heated by induction heating and have high heat resistance can be employed, such as TaC, $Ta_2C$, ZrC, NbC, $Nb_2C$, TiC, MoC, $Mo_2C$, and WC.

Evaluations

Evaluations are carried out by measuring average growth rates in methods for producing Samples A to G in the following manner.

Regarding each of Samples A to G, the crucible 1 has an outer diameter of 140 mm and an inner diameter of 110 mm and the bottom part 12 has a thickness of 20 mm. Regarding Samples A to E and G, the spacer 31 used has a hollow cylindrical shape having an outer diameter of 140 mm, an inner diameter of 80 mm, and a height of 50 mm. Regarding the other, Sample F, the spacer 31 is not used. Regarding Samples A to E, a graphite disc having a thickness of 5 mm is used as the auxiliary heating plate 81. Regarding the others, Samples F and G, the auxiliary heating plate 81 is not used.

Regarding Samples A to G, the seed crystal 51 and the source material powder 52 that are formed of silicon carbide are placed; current is passed through the induction heating coil 74 to heat the source material powder 52 in the range of 2000° C. to 2400° C.; and this heating state is maintained for 100 hours to grow the single crystal 53 formed of silicon carbide.

Regarding Sample A, a single crystal formed of silicon carbide is grown in accordance with the embodiment (single-crystal production apparatus 100 in FIG. 1). p Regarding Sample B, a single crystal formed of silicon carbide is grown with the single-crystal production apparatus 100 according to the first modification. Regarding Sample B, the spacer 31 formed of graphite is used. Regarding Sample C, a single crystal formed of silicon carbide is grown with the single-crystal production apparatus according to the third modification. Regarding Sample D, a single crystal formed of silicon carbide is grown with the single-crystal production apparatus according to the fourth modification. Regarding Sample E, a single crystal formed of silicon carbide is grown with the single-crystal production apparatus according to the fifth modification.

Regarding Sample F, the spacer 31 and the auxiliary heating plate 81 are not used. Accordingly, while the entire surface of the crucible 1 is covered with the heat-insulating member 21, a single crystal formed of silicon carbide is grown. Regarding Sample G, the auxiliary heating plate 81 is not used. Accordingly, while the crucible 1 and the spacer 31 are covered with the heat-insulating member 21, a single crystal formed of silicon carbide is grown.

The average growth rates of single crystals of Samples A to G (increments in height of single crystals in the direction of the central axis α per hour) are summarized in Table.

TABLE

| | Average growth rate (mm/h) |
|---|---|
| Sample A | 0.18 |
| Sample B | 0.19 |
| Sample C | 0.20 |
| Sample D | 0.23 |
| Sample E | 0.24 |
| Sample F | 0.13 |
| Sample G | 0.11 |

Referring to Table, the average growth rates of Samples A to E are significantly higher than those of Samples F and G. Regarding Samples A to E, the auxiliary heating plate 81 is used during growth of silicon carbide single crystals. The presence of the auxiliary heating plate 81 results in an increase in the temperature of the source material powder 52 positioned in the region close to the central axis α. Thus, the presence of the auxiliary heating plate 81 probably allows sufficient sublimation of the source material powder 52.

The average growth rates of Samples C, D, and E are higher than those of Samples A and B. Thus, the feature that the induction heating coil 74 surrounds all of the crucible 1, the spacer 31, and the auxiliary heating plate 81 allows a further increase in the growth rate of the single crystal 53. The average growth rates of Samples D and E are higher than the average growth rate of Sample C. Thus, the feature that the crucible 1, the spacer 31, and the auxiliary heating plate 81 are individually heated at appropriate temperatures allows a further increase in the growth rate of the single crystal 53.

The embodiment described in the present disclosure is a mere example in all respects and should be understood as non-limitative. The scope of the present invention is indicated by Claims. The scope of the present invention is intended to embrace all the modifications within the meaning and range of equivalency of the Claims.

What is claimed is:

1. A method for producing a single crystal, comprising:
    placing a source material powder to contact an inner bottom surface of a crucible and a seed crystal held by a holder within the crucible, the crucible comprising:
        a peripheral wall part that is hollow and has a first opening at one end and a second opening at an other end;
        a bottom wall that is connected to the peripheral wall part to close the first opening;
        a lid part connected to the peripheral wall part to close the second opening, and having a holder that holds the seed crystal;
        a spacer on which the crucible is disposed so as to form a space starting directly below an outer surface of a bottom part of the crucible, and the peripheral wall part; and
        an auxiliary heating plate that faces the outer surface of the bottom part with the space therebetween; and
    growing a single crystal on the seed crystal by induction heating the spacer and the auxiliary heating plate to radiate heat from the spacer and the auxiliary heating plate to heat the outer surface of the bottom part of the crucible to sublime the source material powder to cause recrystallization on the seed crystal.

2. The method for producing a single crystal according to claim 1,
wherein the spacer is hollow and has openings at both ends, and a region surrounded by an inner peripheral surface of the spacer serves as the space starting directly below the outer surface of the bottom part.

3. The method for producing a single crystal according to claim 1,
wherein the auxiliary heating member is formed of graphite.

4. The method for producing a single crystal according to claim 1,
wherein the spacer is formed of graphite.

5. The method for producing a single crystal according to claim 1,
wherein the auxiliary heating member is provided with, in a region facing the outer surface of the bottom part, a coating layer having a lower emissivity than the auxiliary heating member.

6. The method for producing a single crystal according to claim 5,
wherein the coating layer is disposed on a central region of the auxiliary heating member, the central region facing the outer surface of the bottom part and surrounding a central axis passing through a center of the bottom part and a center of the auxiliary heating member, and
a peripheral region of the auxiliary heating member, the peripheral region facing the outer surface of the bottom part and surrounding the central region, is not covered with the coating layer and is exposed to the space.

7. The method for producing a single crystal according to claim 1,
wherein, in the step of placing the source material powder and the seed crystal within the crucible, the source material powder and the seed crystal that are formed of silicon carbide are placed within the crucible, and
in the step of growing the single crystal on the seed crystal, the single crystal formed of silicon carbide is grown on the seed crystal.

8. The method for producing a single crystal according to claim 1,
wherein the crucible has an inner diameter of 110 mm or more.

9. The method for producing a single crystal according to claim 1,
wherein the auxiliary heating member has a through-hole, and
in the step of growing the single crystal on the seed crystal, a radiation thermometer measures a temperature of the crucible through the through-hole.

* * * * *